United States Patent [19]

Sawano et al.

[11] Patent Number: 5,933,442
[45] Date of Patent: Aug. 3, 1999

[54] SEMICONDUCTOR LASER

[75] Inventors: Hiroyuki Sawano; Hitoshi Hotta; Kenichi Kobayashi, all of Tokyo, Japan

[73] Assignee: NEC Corporation, Tokyo, Japan

[21] Appl. No.: 08/872,075

[22] Filed: Jun. 10, 1997

[30] Foreign Application Priority Data

Jun. 10, 1996 [JP] Japan ................................. 8-147245

[51] Int. Cl.⁶ ....................................................... H01S 3/19
[52] U.S. Cl. ............................................. 372/45; 372/46
[58] Field of Search .......................................... 372/45, 46

[56] References Cited

U.S. PATENT DOCUMENTS 5,214,663  5/1993  Kakimoto et al. ...................... 372/45
5,416,790  5/1995  Yodoshi et al. ......................... 372/45

FOREIGN PATENT DOCUMENTS 6-196810  7/1994  Japan .

OTHER PUBLICATIONS

Ishikawa et al., "InGaAlP Transverse Mode Stabilized... Fabricated by MOCVD Selective Growth", Ext'd Abs of the 18th (1986 Int'l) Conf. on Solid State Devices and Materials, Tokyo, 1986, pp. 153–156, (no month available).
Preliminary Reports of 11th Semiconductor Laser Symposium (1994), p.21, (no month available).

*Primary Examiner*—Rodney Bovernick
*Assistant Examiner*—Quyen Phan Leung
*Attorney, Agent, or Firm*—Sughrue, Mion, Zinn, Macpeak & Seas, PLLC

[57] ABSTRACT

A p-type saturable light absorbing layer is provided between p-type AlGaInP clad layers. Oxygen is doped in the p-type saturable light absorbing layer to generate non-luminescent recombination center, thereby consuming minority carrier. By this, minority carrier life of the p-type saturable light absorbing layer is lowered without saturation. Therefore, saturable light absorbing amount necessary for self-pulsation can be reduced to achieve a semiconductor laser with low threshold value, low drive current and high reliability.

13 Claims, 10 Drawing Sheets

$(Al_x Ga_{1-x})_{0.5} In_{0.5} P$
$0.7 = X$

O DOPE OR NON-DOPE 1.2 μm $(Al_x Ga_{1-x})_{0.5} In_{0.5} P$
$0.7 = X$

Si DOPE OR NON-DOPE

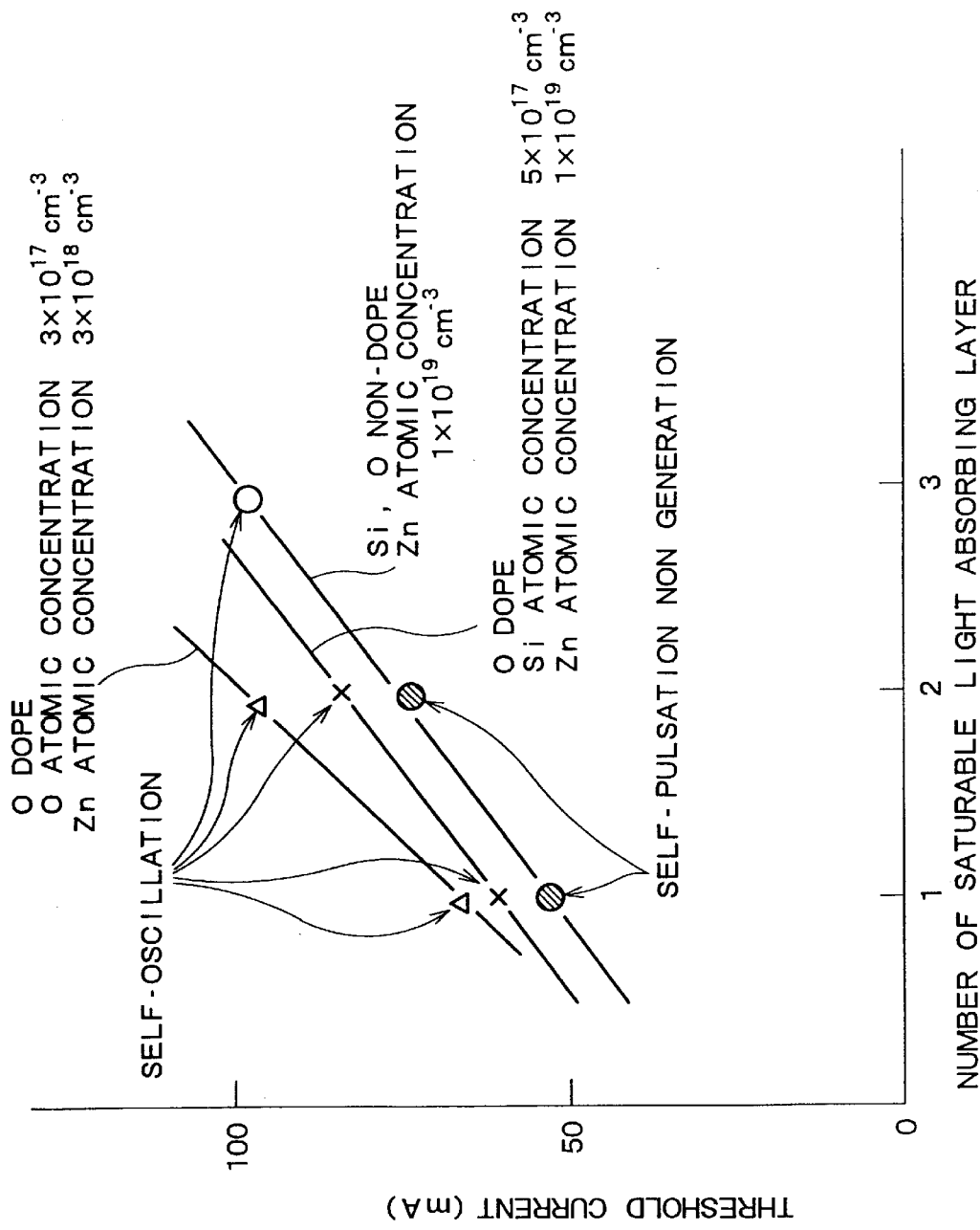

SEMICONDUCTOR LASER

BACKGROUND OF THE INVENTION

1. Field of the Invention

The present invention relates to a structure of a semiconductor laser. More specifically, the invention relates to a structure of a semiconductor laser capable of low noise operation.

2. Description of the Related Art

Conventionally, a semiconductor laser has been widely employed in information apparatus and information processing apparatus, as a light source of an optical disk unit, and a light source of an optical communication. Particularly, in the recent years, an optical disk medium, such as a DVD (digital versatile disk), a magneto-optic (MO) disk and so forth have been utilized as high density storage devices. In such high density storage devices, the semiconductor laser is used as a light source.

In the semiconductor laser to be employed as an optical pick-up for the device set forth above, a noise should be generated due to reflected optical feed back from the disk surface of the optical disk. Therefore, it is an important task to suppress generation of the noise.

As one method for reducing generation of the noise is to drive the semiconductor laser at high frequency. This utilizes the fact that pulsation spectrum becomes multi-mode by high frequency driving to reduce influence of the optical feed back. However, in this case, a high frequency superimposing module becomes necessary increasing the cost. Also, a problem (problem of EMC) is encountered due to generation of electromagnetic noise.

A self-pulsation laser exhibits low noise characteristics similar to the high frequency driving. Also, this type of laser is superior for low cost and no possibility of generation of the electromagnetic noise. Therefore, there is a strong demand for development of practically useful self-pulsation laser of low threshold current and low drive current, and can perform self-pulsation with reliability for long period.

The operation of self-pulsation can be obtained by introducing a saturable light absorbing body within a laser resonator and controlling a saturable light absorbing amount. Such self-pulsation and the laser structure therefor has been reported in Extended Abstract of 18th Conference on Solid State Devices and Material (1986), pp 153, No. D-1-2 and Preliminary Reports of 11th Semiconductor Laser Symposium (1994) pp. 21. These semiconductor lasers take active region on the side of mesa-stripe as the saturable light absorbing layer. This semiconductor laser has large light absorption on the side of the laser light emitting portion to results in large astigmatism of 10 $\mu$m to 50 $\mu$m.

On the other hand, there has been proposed a semiconductor laser element, in which the saturable light absorbing layer is introduced in parallel to the active layer, namely in a part of a clad layer. As this type of semiconductor laser element, AlGaAs self-pulsation laser has been proposed (Japanese Unexamined Patent Publication (Kokai) No. Heisei 6-196810).

Hereinafter, discussion will be given for the conventional self-pulsation semiconductor laser as disclosed in Japanese Unexamined Patent Publication No. Heisei 6-196810.

FIG. 1 is a section showing this conventional self-pulsation semiconductor laser element. The shown semiconductor laser is constructed with an n-type GaAs substrate 102. An n-type first $Al_xGa_{1-x}As$ clad layer 103 is formed on the GaAs substrate 102 and has a composition ratio x of 0.51. An n-type first saturable light absorbing layer 104 is formed on the $Al_xGa_{1-x}As$ clad layer 103 in a thickness of 0.01 $\mu$m to 0.04 $\mu$m, which has a carrier concentration of $2\times10^{17}$ cm$^{-3}$ to $5\times10^{17}$ cm$^{-3}$, and composition ratio x of 0.12 to 0.14. An n-type second $Al_xGa_{1-x}As$ clad layer 105 is formed on the n-type first saturable light absorbing layer 104 in a thickness of 0.27 to 0.33 $\mu$m and has a composition ratio x of 0.51. An $Al_xGa_{1-x}As$ active layer 106 is formed on the n-type second $Al_xGa_{1-x}As$ clad layer 105 in a thickness of 0.08 $\mu$m and has a composition ratio x of 0.13. A third p-type $Al_xGa_{1-x}As$ clad layer 107 is formed on the active layer 106 in a thickness of 0.27 $\mu$m to 0.33 $\mu$m and has the composition ratio x of 0.51. A second p-type saturable light absorbing layer 108 consisting of p-type $Al_xGa_{1-x}As$ is formed on the third $Al_xGa_{1-x}As$ clad layer 107 in a thickness of 0.01 $\mu$m to 0.04 $\mu$m and has a carrier concentration of $4\times10^{17}$ cm$^{-3}$ to $2\times10^{18}$ cm$^{-3}$ and the composition ratio x of 0.12 to 0.14. A p-type fourth $Al_xGa_{1-x}As$ clad layer 109 is formed on the second saturable light absorbing layer 108 and has the composition ratio x of 0.51. A p-type GaAs cap layer 110 is formed on the upper surface of a ridge portion of the p-type fourth $Al_xGa_{1-x}As$ clad layer 109. An n-type GaAs current block layer 112 is formed in a portion where a part of the p-type fourth $Al_xGa_{1-x}As$ clad layer 109 and the p-type GaAs cap layer 110 is removed. A p-type GaAs contact layer 111 is formed over the p-type GaAs cap layer 110 and the n-type GaAs current blocking layer 112. A p-type electrode 113 is formed on the p-type GaAs contact layer 111, and an n-type electrode 101 is formed on the lower surface of the n-type GaAs substrate 102.

Here, by appropriately selecting the composition ratio x and layer thickness of the n-type first saturable light absorbing layer 104 and composition ratio x and the layer thickness of the p-type second saturable light absorbing layer 108, low optical feed back noise characteristics by the self-pulsation can be obtained. This laser has a superior feature of low astigmatism, and suitable for mounting on the optical disk unit.

However, in the conventional semiconductor laser set forth above, in the saturable light absorbing layer for generating the self-pulsation, large light absorbing amount is necessary to increase threshold gain for laser pulsation, which results in rising of threshold current and drive current.

Particularly, in AlGaInP red laser, as a result of high threshold current, difficulty in obtaining high reliability can be encountered.

SUMMARY OF THE INVENTION

It is an object of the present invention to provide a semiconductor laser having low threshold value, low drive current and long period reliability.

A semiconductor laser, according to one aspect of the present invention, comprises: a first conductivity type semiconductor substrate; a first conductivity type clad layer, an active layer and a second conductivity type clad layer stacked on the first conductivity type semiconductor substrate in sequential order; and a saturable light absorbing layer provided in a part of the first conductivity type clad layer and/or the second conductivity type clad layer and having a band gap substantially equal to the active layer, the saturable light absorbing layer being doped with oxygen in addition to an impurity generating the conductivity type of the clad layer.

A semiconductor laser, according to the second aspect of the present invention, comprises: a first conductivity type semiconductor substrate; a first conductivity type clad layer, an active layer and a second conductivity type clad layer stacked on the first conductivity type semiconductor substrate in sequential order; and a saturable light absorbing layer provided in a part of the first conductivity type clad layer and/or the second conductivity type clad layer and having a band gap substantially equal to the active layer, the saturable light absorbing layer being doped with an impurity generating a conductivity type opposite to the clad layer in the extent not changing conductivity type of the saturable light absorbing layer, in addition to an impurity generating the conductivity type of the clad layer.

The active layer and/or the saturable light absorbing layer may be quantum well structure or strained quantum well structure.

The active layer, the clad layer and the saturable light absorbing layer may be AlGaInP or AlGaAs, the first conductivity type impurity may be Si or Se; and the second conductivity type impurity may be Zn or Mg.

A source of oxygen for oxygen doping may be oxygen gas, water, hydrogen peroxide solution, carbon monoxide or carbon dioxide.

A thickness of quantum well layer of the saturable light absorbing layer may be thicker than a layer thickness of quantum well layer of the active layer, and the quantum well layer of the saturable light absorbing layer may be AlGaInP having greater Al content than quantum well of the active layer.

On the other hand, in-plane compression strain amount of the saturable light absorbing layer may be higher than in-plane compression strain amount of the active layer and the quantum well layer of the saturable light absorbing layer may be AlGaInP having greater Al content than the quantum well layer of the active layer. In-plane tension strain amount of the saturable light absorbing layer may be lower than in-plane tension strain amount of the active layer and the quantum well layer of the saturable light absorbing layer may be AlGaInP having greater Al content than the quantum well layer of the active layer. Or, the saturable light absorbing layer may have in-plane compression strain and the active layer may have in-plane tension strain and the quantum well layer of the saturable light absorbing layer may be AlGaInP having greater Al content than the quantum well layer of the active layer.

In the present invention, the saturable light absorbing layer is provided in a part of the first conductivity type clad layer and/or the second conductivity type clad layer. Since impurity and oxygen generating the conductivity type opposite to the saturable light absorbing layer is doped in the saturable light absorbing layer, non-luminescent recombination center is generated in the saturable light absorbing layer by doping to consume minority carrier.

By this, the minority carrier life of the saturable light absorbing layer is lowered to reduce necessary saturable light absorbing amount for self-pulsation to obtain low threshold value, low drive current and high reliability.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to be present invention, but are for explanation and understanding only.

In the Drawings:

FIGS. 6A and 6B are illustrations showing composition and doping profile of sample employed in the experiment of FIG. 5, in which FIG. 6A is an illustration showing with respect to O dope, and FIG. 6B is an illustration showing with respect to Si dope;

FIG. 7 is an illustration showing a plot of threshold current with respect to number of saturable light absorbing layer in the case where a multi-quantum well layer is employed as a p-type saturable light absorbing layer of the semiconductor layer shown in FIG. 2;

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. Further, well-known structures are not shown in detail in order to avoid unnecessary obscure the present invention.

Figure 1:
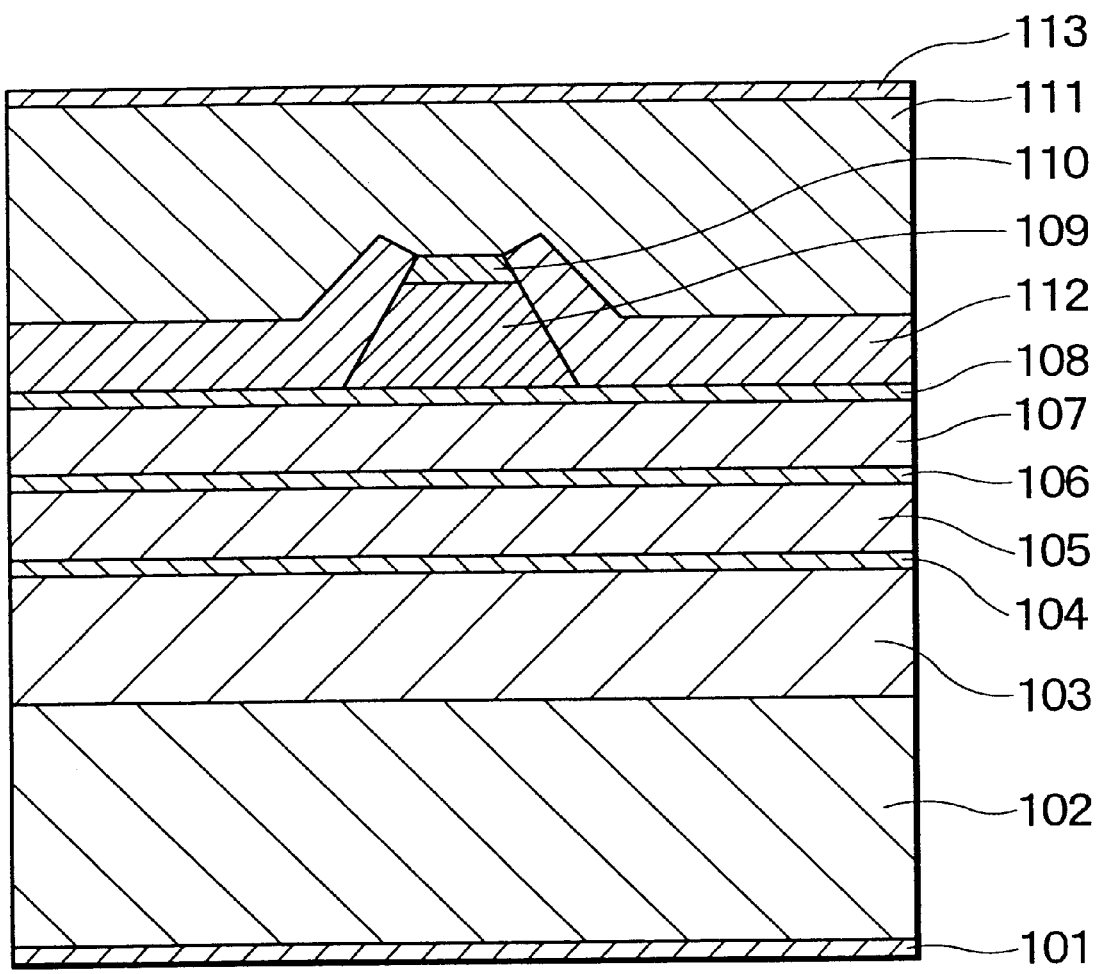
FIG. 1 is a section showing a construction of a semiconductor laser disclosed in Japanese Unexamined Patent Publication No. (Heisei) 6-196810, as one example of the conventional semiconductor laser.
Figure 2:
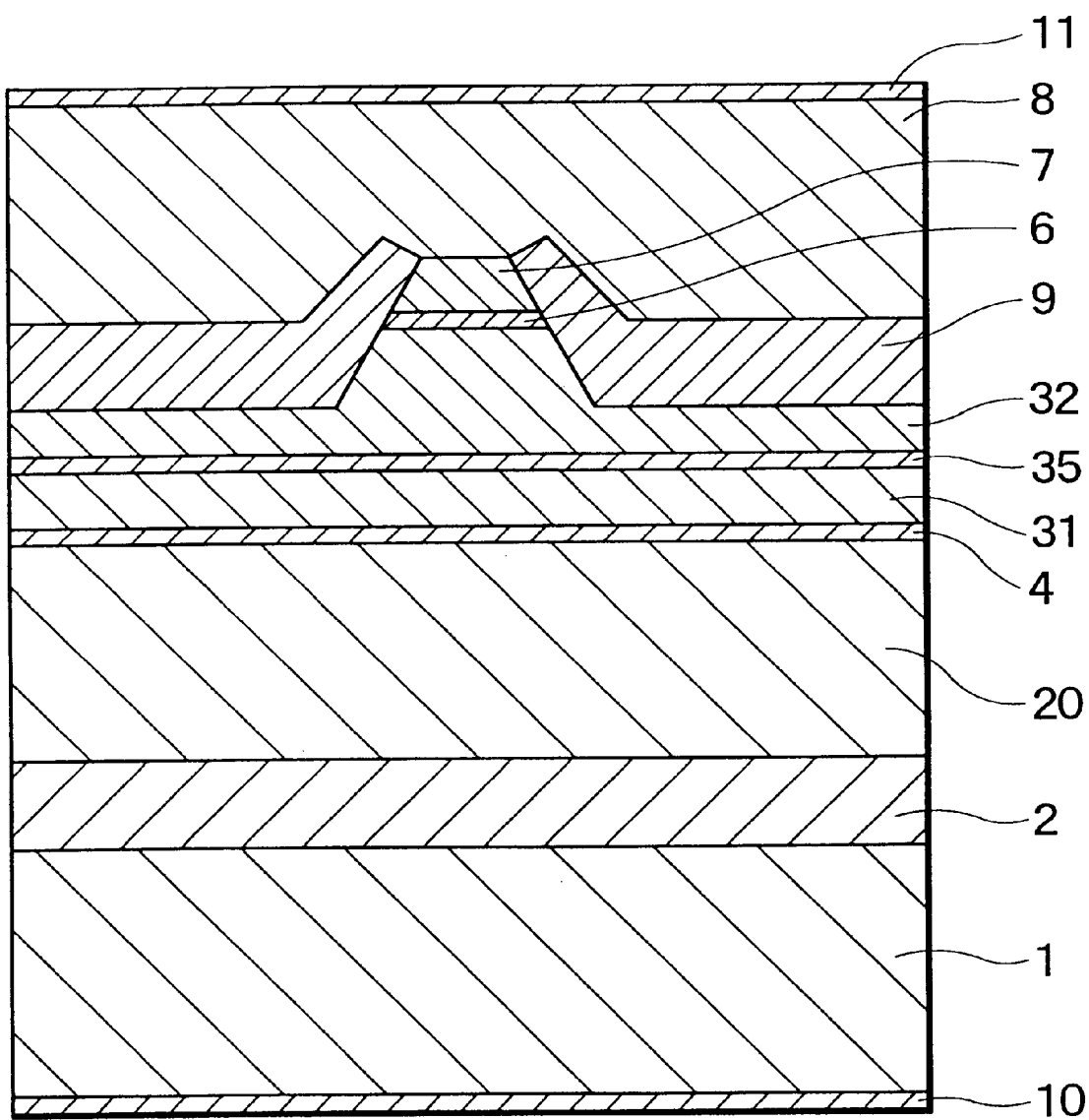
FIG. 2 is a section showing one embodiment of a semiconductor laser according to the present invention.

FIG. 2 is a section showing one embodiment of a semiconductor laser according to the present invention. The semiconductor laser is constructed with a GaAs substrate 1 of n-type as first conductive type. A GaAs buffer layer 2 is formed on the GaAs substrate 1. An n-type AlGaInP clad layer 20 is formed on the GaAs buffer layer 2. An active layer 4 is formed on the n-type AlGaInP clad layer 20. An AlGaInP clad layer 31 of p-type as second conductivity type is formed on the active layer 4. A p-type saturable light absorbing layer 35 p-type AlGaInP is formed on the p-type AlGaInP clad layer 31. A p-type AlGaInP layer 32 is formed on the p-type saturable light absorbing layer 35. A p-type GaInP hetero buffer layer 6 is formed on the p-type AlGaInP clad layer 32. A p-type GaAs cap layer 7 is formed on the p-type GaInP hetero buffer layer 6. An n-type GaAs current blocking layer 9 is formed in a portion where a part of the p-type AlGaInP clad layer 32, the p-type GaInP hetero buffer layer 6 and the p-type GaAs cap layer 7 is removed. A p-type GaAs cap layer 8 is formed on the p-type GaAs cap layer 7 and the n-type GaAs current blocking layer 9. A p-type electrode 11 is formed on the p-type GaAs cap layer 8. An n-type electrode 10 is formed on the lower surface of the n-type GaAs substrate 1.

Hereinafter, a fabrication process of the semiconductor laser constructed as set forth above, will be discussed hereinafter.

At first, by a low pressure MOVPE method, on the n-type GaAs substrate 1, the GaAs buffer layer 2, the n-type AlGaInP clad layer 20, the active layer 4, the p-type AlGaInP clad layer 31, the p-type saturable light absorbing layer 35, the p-type AlGaInP clad layer 32, the p-type GaInP hetero buffer layer 6 and p-type GaAs cap layer 7 are stacked in sequential order.

Next, by photolithography and etching employing a $SiO_2$ mask (not shown), mesa-stripe is formed with the p-type AlGaInP clad layer 32, the p-type GaInP hetero buffer layer 6 and the p-type GaAs cap layer 7.

Next, with taking a $SiO_2$ mask as a selective growth mask, the n-type GaAs current blocking layer 9 is formed. Furthermore, removing the $SiO_2$ mask, and subsequently, the p-type GaAs cap layer 8 is formed by the low pressure MOVPE method.

Next, the p-type electrode 11 is formed on the cap layer 8. Subsequently, the opposite side to the p-type electrode 11 of the n-type GaAs substrate 1 is polished into an appropriate thickness. Finally, the n-type electrode 10 is formed on the lower surface of the n-type GaAs substrate 1.

As a material for low pressure MOVPE method, trimethyl aluminum, triethyl gallium, trimethyl indium, hydrogen phosphide, arsine and the like, as a n-type dopant, disilane, as a p-type impurity, diethyl zinc, as a source of O (oxygen), water were employed. Growth temperature was 660° C., growth pressure was 70 Torr, and a ratio of (supply amount of a material of V group of periodic table)/(supply amount of a material of III group of periodic table) was 500.

Hereinafter, discussion will be given with respect to composition and doping amount profile of the portion from the active layer 4 to the p-type saturable light absorbing layer 35 of the semiconductor laser set forth above.

Figure 3:
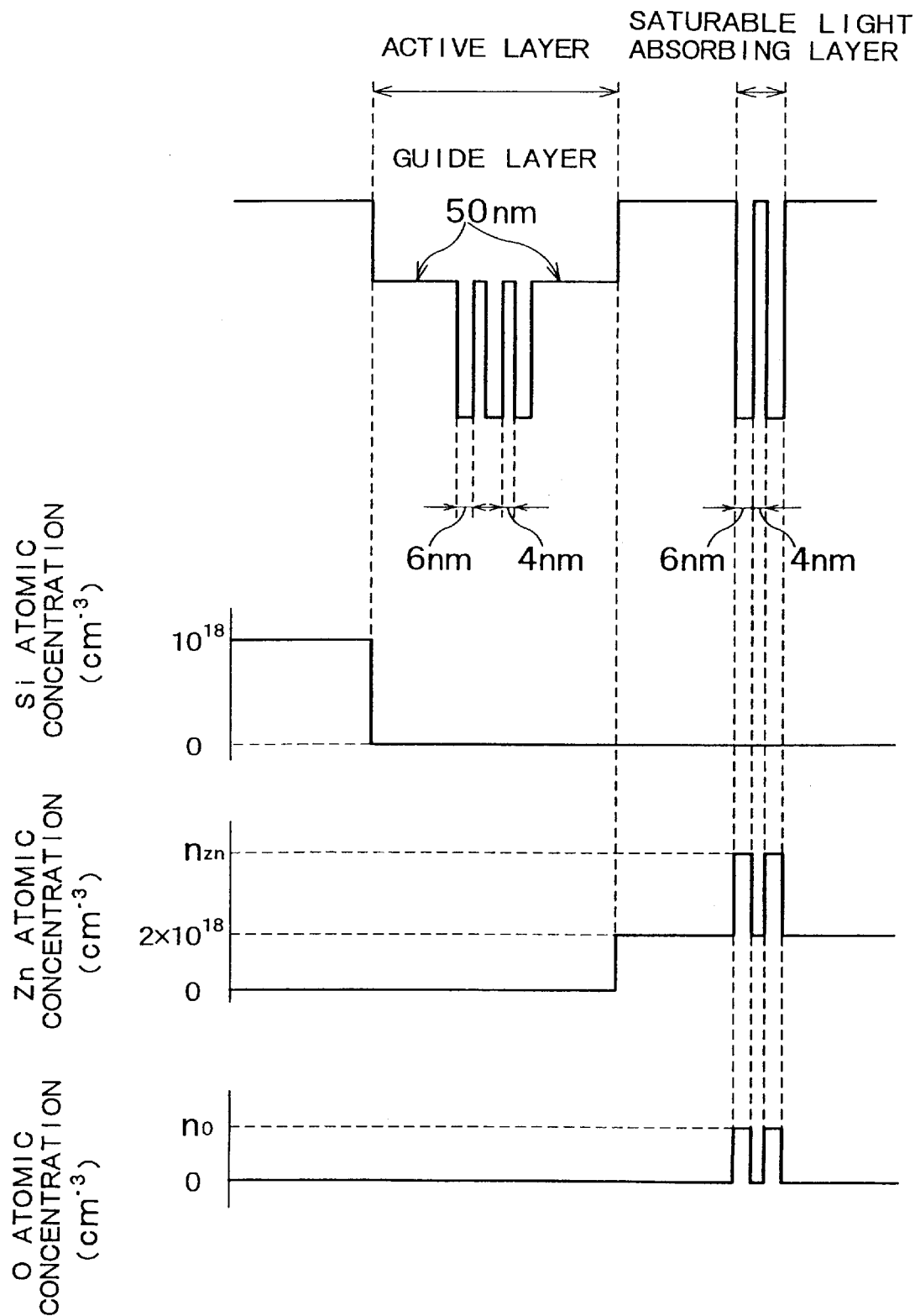
FIG. 3 is an illustration showing one example of composition and doping profile in a part of the semiconductor laser shown in FIG. 2.

FIG. 3 is an illustration showing one example of composition and doping profile in a portion of the semiconductor laser element shown in FIG. 2.

As shown in FIG. 3, in the p-type saturable light absorbing layer 35, in addition to Zn (e.g., atomic concentration nz=$3 \times 10^{18}$ $cm^{-3}$) as p-type impurity to be acceptor or donor, a small amount of O (e.g., atomic concentration=$3 \times 10^{17}$ $cm^{-3}$) is doped. It should be noted that, in FIG. 3, while two layers of the saturable light absorbing layer 35 are illustrated, self-pulsation can be obtained even with single layer. In this case, the threshold current was 66 mA.

Here, in the p-type light absorbing layer 35 are illustrated, self-pulsation can be obtained even with single layer. In this case, the threshold current was 66 mA.

Here, in the p-type saturable light absorbing layer 35, Si as n-type impurity may be doped in place of O.

Figure 4:
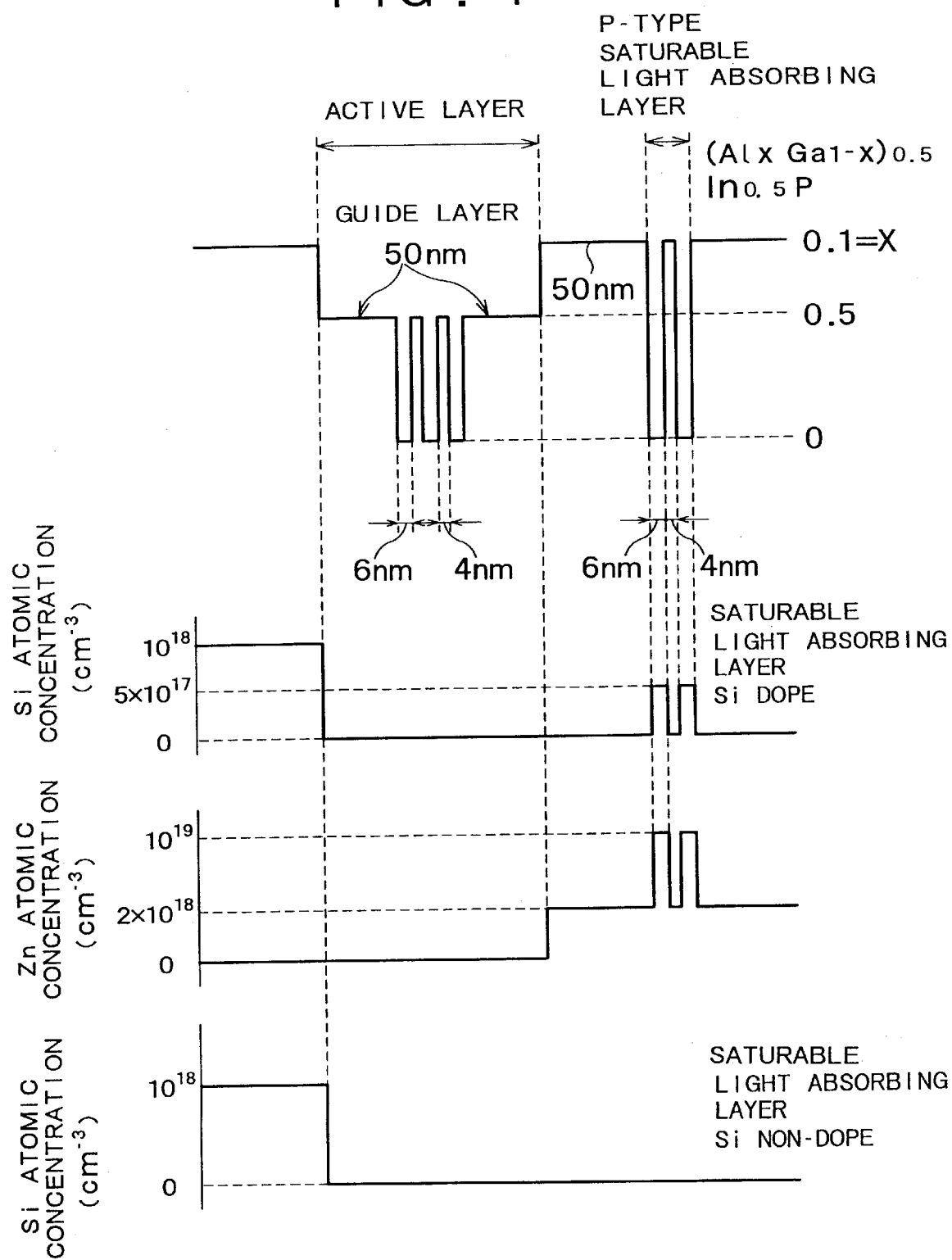
FIG. 4 is an illustration showing another example of composition and doping profile in a part of the semiconductor laser shown in FIG. 2.

FIG. 4 is an illustration showing another example of composition and doping profile in a portion of the semiconductor laser element shown in FIG. 2.

As shown in FIG. 4, in the p-type saturable light absorbing layer 35, in addition to Zn (atomic concentration=$1 \times 10^{19}$ $cm^{-3}$) as p-type impurity, a small amount of Si (atomic concentration=$5 \times 10^{17}$ $cm^{-3}$) as n-type impurity generating conductivity type opposite to that of the p-type saturable light absorbing layer 35, is doped. Even in FIG. 4, the saturable light absorbing layer 35 is illustrated as two layers. However, self-pulsation can be obtained even with the single layer. In this case, the threshold current was 52 mA.

Figure 5:
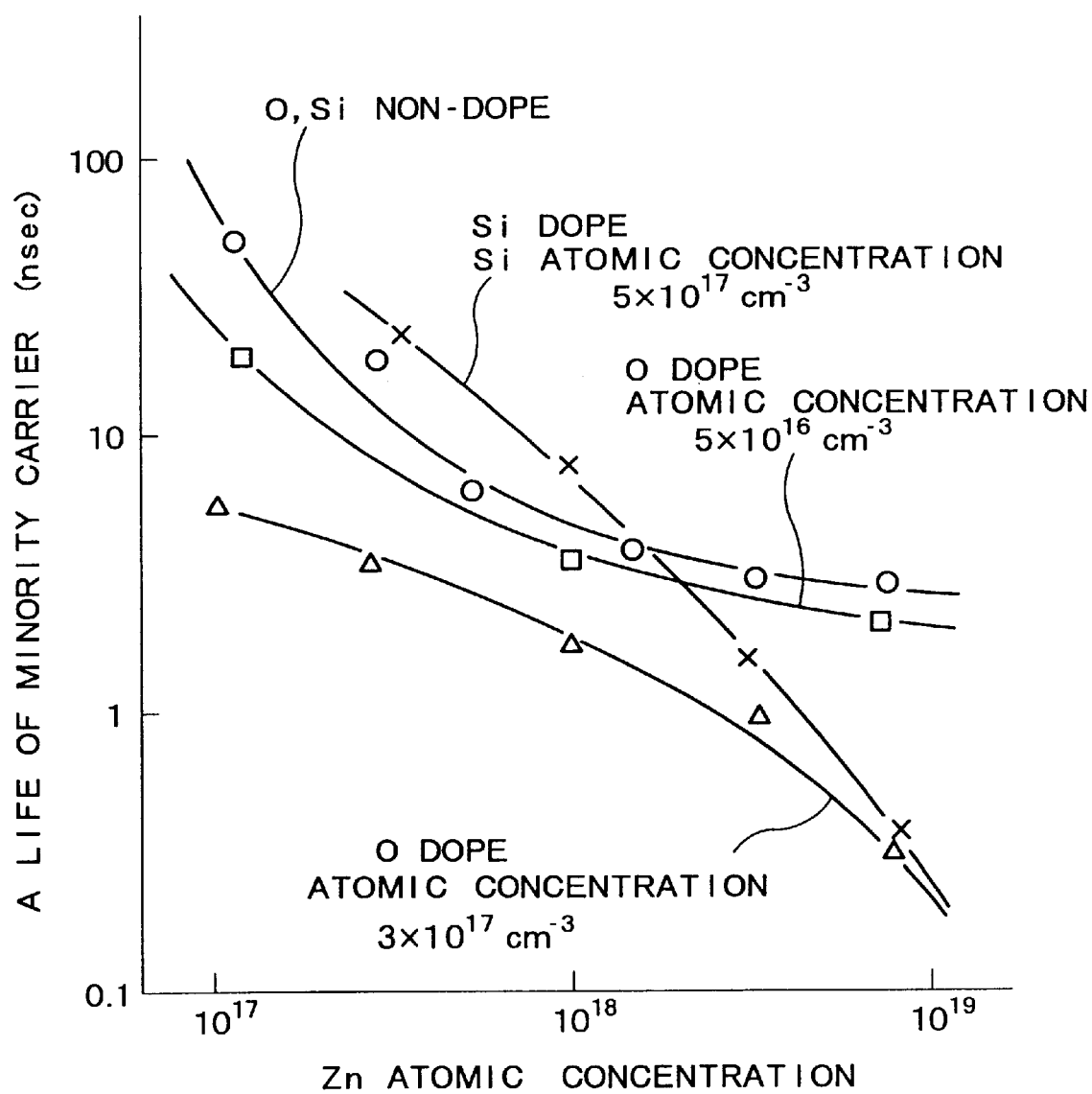
FIG. 5 is an illustration showing a result of checking a minority carrier with respect to Zn atomic concentration of 1.2 $\mu$m thick bulk crystal.
Figure 6A:
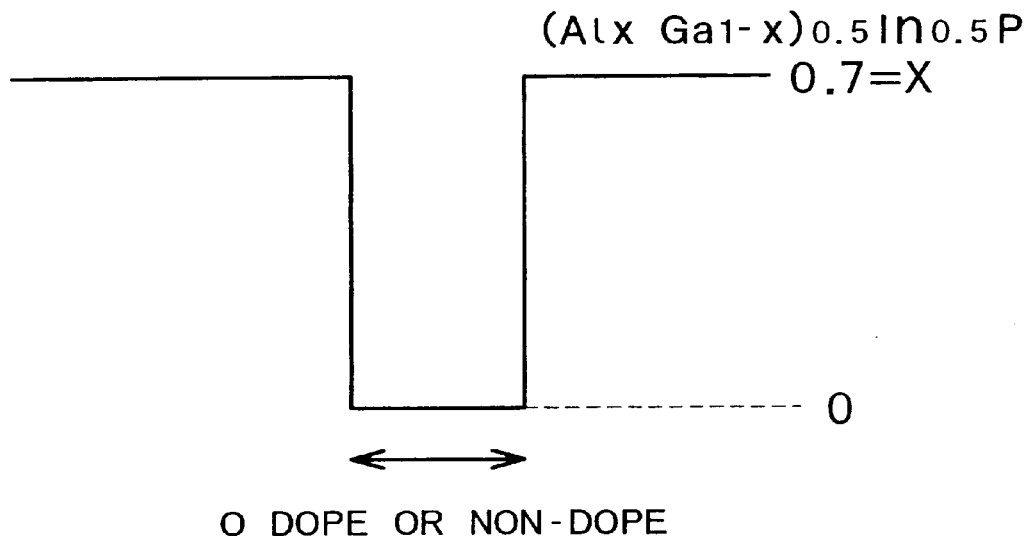
Figure 6B:
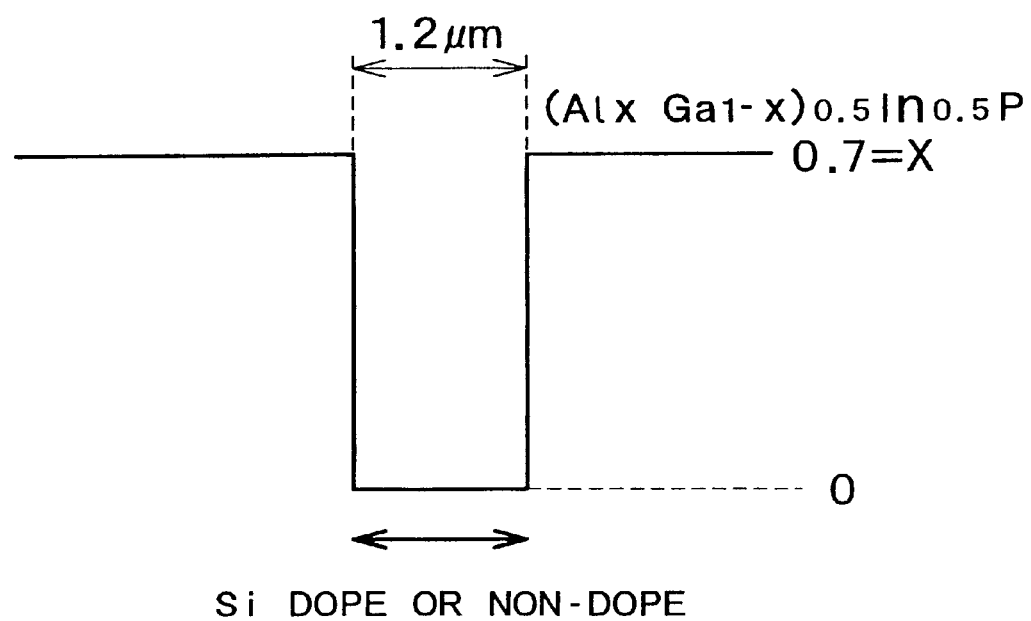

FIG. 5 is an illustration showing a result of checking of a life of minority carrier with respect to Zn atomic concentration of 1.2 μm thick bulk crystal. On the other hand, FIGS. 6A and 6B are illustration showing composition and doping profile of samples used in the experiments shown in FIG. 5, in which FIG. 6A shows O dope and FIG. 6B show Si dope.

It should be noted that, lift time of the minority carrier was checked by time-resolution photo-luminescence method. As shown in FIG. 5, the life-time of the minority carrier electron has a tendency to lower according to increasing of Zn atomic concentration irrespective of Si dope, non-doping or doping amount of O. This is because hole is produced and luminescent recombination is increased by doping of Zn.

As shown in FIG. 5, in case of a crystal which is not intentionally doped with O and Si (atomic concentration measured by SIMS is O: $2 \times 10^{16}$ $cm^{-3}$ or less, Si: $1 \times 10^{16}$ $cm^{-3}$ or less), lowering of life of minority carrier is saturated over a point where Zn atomic concentration is $1 \times 10^{18}$ $cm^{-3}$. Even when Zn atomic concentration is increased to be $1 \times 10^{19}$ $cm^{-3}$, the life of minority carrier is large as 2.6 ns. This is because that according to increasing of Zn atomic concentration, greater portion of the doped Zn atom is taken in the crystal between gratings, which is the position incapable of generation of majority carrier. On the other hand, the crystal doped with a small amount of O (atomic concentration=$3 \times 10^{17}$ $cm^{-3}$) and the crystal doped with a small amount of Si (atomic concentration=$5 \times 10^{17}$ $cm^{-3}$), saturation of lowering of minority carrier life was not observed up to Zn atomic concentration of $1 \times 10^{19}$ $cm^{-3}$. At Zn atomic concentration $1 \times 10^{19}$ $cm^{-3}$, life of the minority carrier can be reduced to be 0.2 ns in either case of Si dope amount of $5 \times 10^{17}$ $cm^{-3}$ or O dope amount of $3 \times 10^{17}$ $cm^{-3}$. This is considered that non-luminescent recombination center is generated by doping of O atom, or Zn—Si pair generated by doping of Si atom becomes non-luminescent recombination center to consume minority carrier.

FIG. 7 is an illustration showing a plot of the threshold current relative to number of the saturable light absorbing layer when the multi-quantum well structure is employed as the p-type saturable light absorbing layer 35 of the semiconductor laser shown in FIG. 2.

Zn atomic concentration of the saturable light absorbing layer is $1 \times 10^{19}$ $cm^{-3}$ (when O is not intentionally doped) or $3 \times 10^{18}$ $cm^{-3}$ (when O is doped in atomic concentration of $3 \times 10^{17}$ $cm^{-3}$).

As shown in FIG. 7, when Si or O was not intentionally doped, self-pulsation can not be obtained with one or two layers of the saturable light absorbing layers, and while self-pulsation can be obtained with three layers of saturable light absorbing layers, the threshold current is high to be 89 mA. In contrast to this, when fine amount (atomic concentration=$3 \times 10^{17}$ $cm^{-3}$) of O is doped or when fine amount (atomic concentration=$5 \times 10^{17}$ $cm^{-3}$) of Si is doped, self-pulsation could be obtained even with single layer of the saturable light absorbing layer, and the threshold current was low as 66 mA in case where O is doped and 52 mA in case where Si is doped. This is because that the minority carrier life in the saturable light absorbing layer is lowered by doping of fine amount of O or Si into the p-type saturable light absorbing layer 35 to lower necessary saturable light absorbing amount for self-pulsation. By this, the semiconductor laser of low drive current and reliable for long period can be obtained.

Here, it is required that band gaps of the active layer and the saturable light absorbing layer have to be substantially equal to each other (difference being less than or equal to 100 meV therebetween). In the semiconductor laser having the active layer and the saturable light absorbing layer of quantum well structure, by providing greater compression strain amount for the saturable light absorbing layer than the strain amount of the active layer and/or by providing greater layer thickness for the quantum well of the saturable light absorbing layer than the layer thickness of the active layer, it becomes possible to increase Al content in the saturable light absorbing layer.

For example, by applying +0.65% in-plane compression strain for the quantum well of the active layer of Al content 0, no strain and 5 nm of layer thickness, in the layer thickness of 5 nm equal to that of the active layer, Al content in the saturable light absorbing layer can be 0.2. Since Al has high coupling ability with oxygen, doping efficiency of oxygen can be improved to facilitate lowering of the minority carrier life of the saturable light absorbing layer.

On the other hand, the saturable light absorbing layer can be formed of AlGaAs.

For example, in the case where the quantum well layer of the active layer is Al content 0, an AlGaAs saturable light absorbing layer of Al content 0.4 can be employed.

Here, values of parameters shown in FIGS. 3 and 4 are typical values. In the shown embodiment of the present invention, the quantum well layer and the barrier layer of the active layer and the saturable light absorbing layer are required to have the layer thickness less than or equal to 10 nm. The active layer and the saturable light absorbing layer can be strained quantum well layer structure or bulk. On the other hand, the layer thickness of the guide layer is required to be less than or equal to 100 nm, and distance between the saturable light absorbing layer and the active layer is required to be less than or equal to 400 nm. A structure, in which the n-type GaAs current blocking layer is in contact with the saturable light absorbing layer 35, can be employed. Also, Al content in the clad layer may be selected within a range of 0.5 to 1.0. Al content of the guide layer is required to be lower than the Al content of the clad layer. On the other hand, a difference of the band gap of the saturable light absorbing layer and the band gap of the active layer is required to be less than or equal to 100 meV. For example, AlGaInP or AlGaAs having Al content greater than that of the active layer can be employed as the saturable light absorbing layer.

On the other hand, the atomic conentration of Zn in the saturable light absorbing layer is required to be greater than or equal to $10^{18}$ cm$^{-3}$ and less than or equal to $5\times10^{19}$ cm$^{-3}$. The atomic conentration of Si in the saturable light absorbing layer is required to be in a range not changing the conductivity type into n-type. Even when O or Si is not intentionally doped, it is possible that such element may admixed in an amount less than or equal to a detection limit ($1\times10^{16}$ cm$^{-3}$ in case of SIMS). However, in order to effectively lower the minority carrier life in the saturable light absorbing layer, an appropriate amount but not less than $5\times10^{16}$ cm$^{-3}$ of O or an appropriate amount but not less than $2\times10^{16}$ cm$^{-3}$ of Si may be intentionally doped. In the shown embodiment, vapor of water (H$_2$O) is employed for doping O, other material, such as oxygen gas, hydrogen peroxide solution, carbon monoxide or carbon dioxide and the like may be employed. Also, while discussion has been given with taking Si as n-type impurity, similar effect can be obtained by employing Se in place of Si. In this case, as a source of Se, hydrogen selenide can be used. Also, even when Mg is used as the p-type impurity, similar effect can be obtained. In this case, as a source of Mg, cyclopentadium magnesium can be used.

Also, in an AlGaAs laser having pulsation wavelength of 0.7 to 0.9 μm, similar effect can be obtained.

In this case, as p-type impurity, Mg or Zn can be used and as n-type impurity, Si or Se can be used. In such case, similarly to the AlGaInP semiconductor laser, saturable light absorbing amount necessary for self-pulsation can be reduced to realize semiconductor laser of low threshold valve, low drive current and long reliability.

Figure 8:
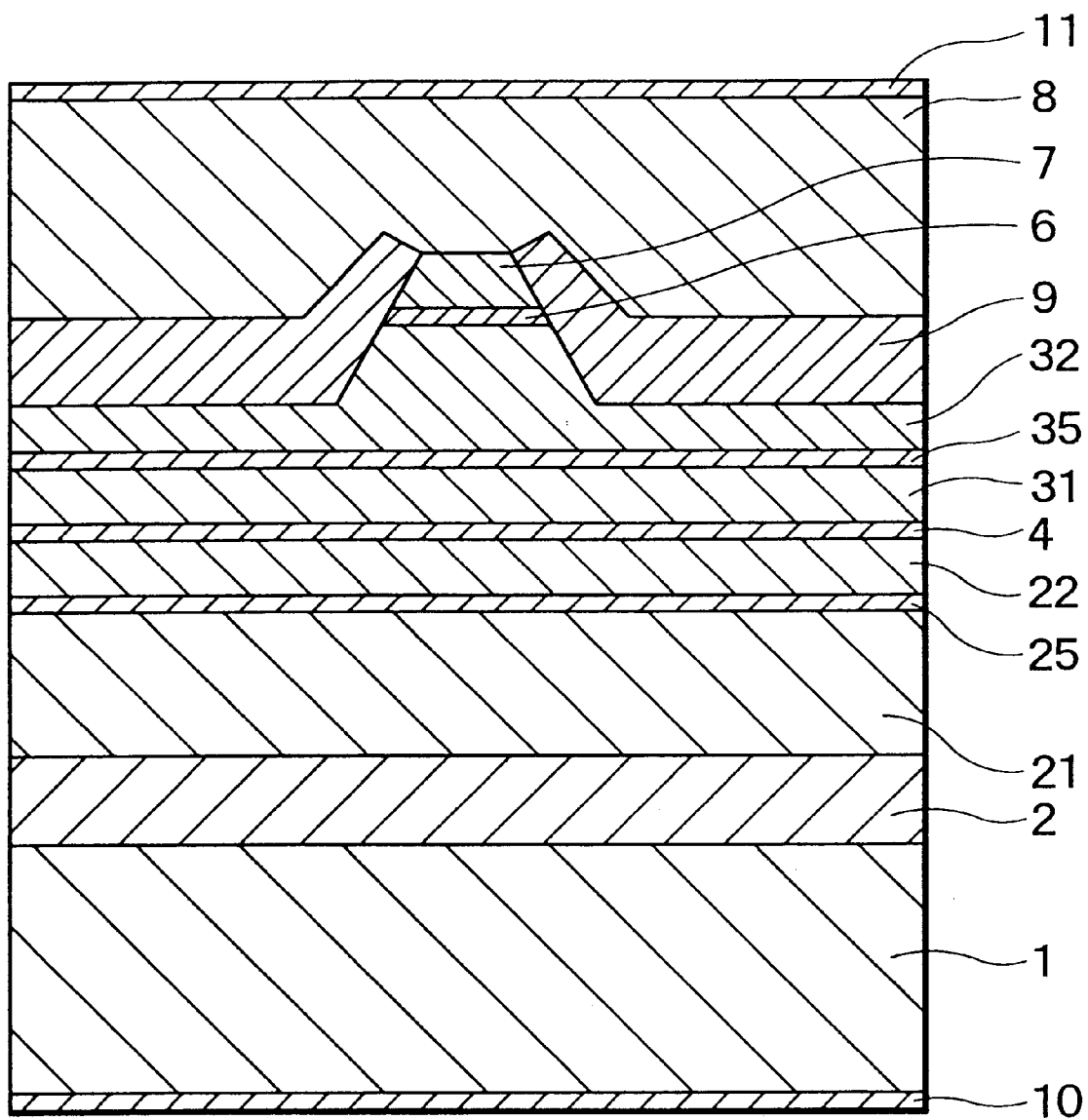
FIG. 8 is a section showing the second embodiment of the semiconductor laser according to the present invention.

FIG. 8 is a section showing the second embodiment of the semiconductor laser according to the present invention.

The shown embodiment as shown in FIG. 8 is differentiated from the embodiment of FIG. 2, in that in place of the n-type AlGaInP clad layer 20, a n-type AlGaInP clad layer 21, n-type saturable light absorbing layer 25 and the n-type AlGaInP clad layer 22 are stacked in sequential order on the GaAs buffer layer 2. Other construction is similar to that of the embodiment of FIG. 2.

Figure 9:
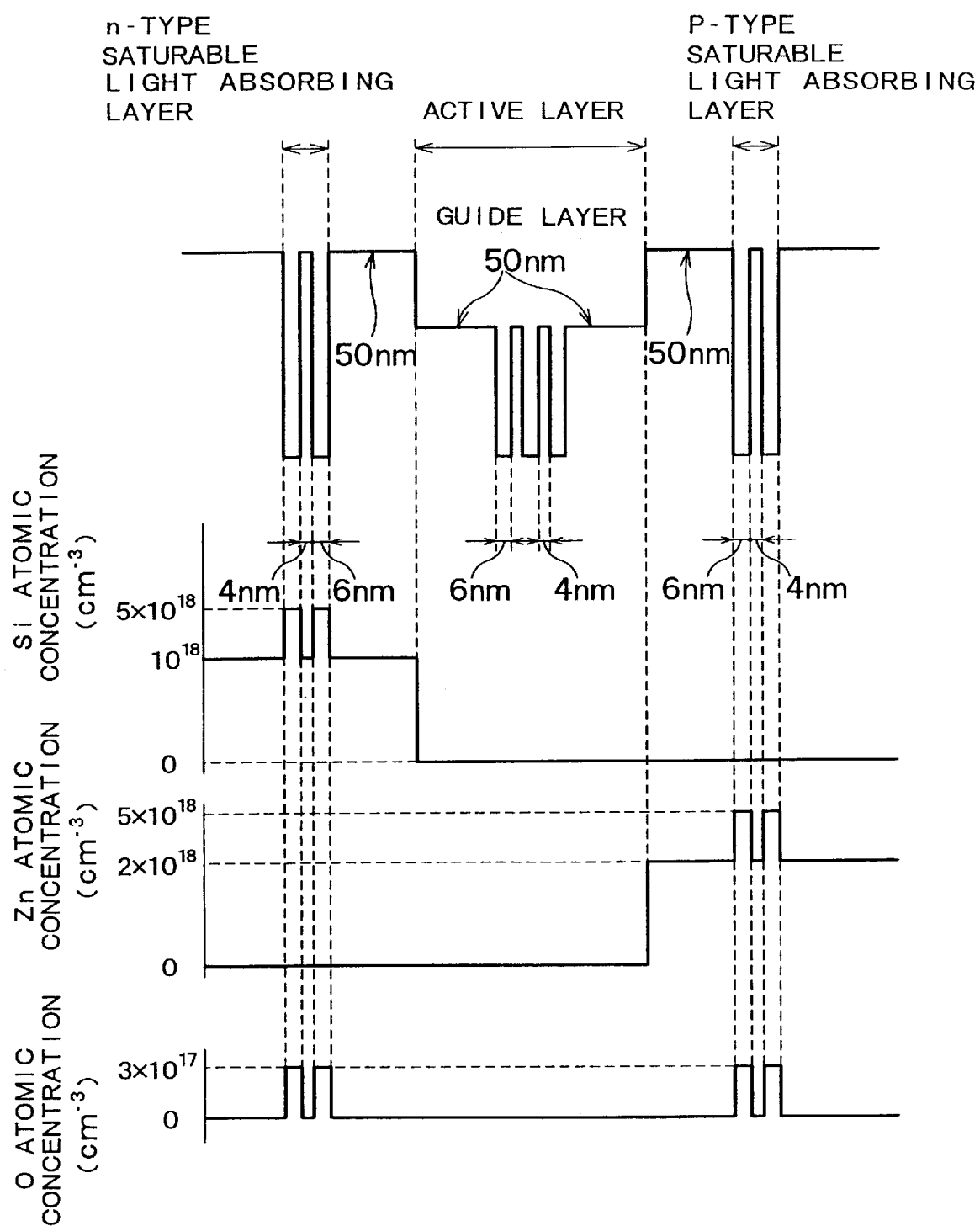
FIG. 9 is an illustration showing one example of composition and doping profile in a part of the semiconductor laser of FIG. 8.

FIG. 9 is an illustration showing one example of the composition and doping profile in a part of the semiconductor laser shown in FIG. 8.

As shown in FIG. 8, the p-type saturable light absorbing layer 35 is similar to that in the embodiment of FIG. 3. However, since the n-type saturable light absorbing layer 25 is inserted between the n-type AlGaInP clad layers 21 and 22, and O of $3\times10^{17}$ cm$^{-3}$ is intentionally doped.

In the shown embodiment, since the refraction index profile is symmetric at both sides of the n-type layer and p-type layer, clear vertical near-field image can be obtained. Furthermore, in the same reason set out in the first embodiment, the self-pulsation can be generated at low threshold value, and the semiconductor laser having low drive current and long reliability can be obtained.

Here, Zn of n-type impurity may be doped in the p-type saturable light absorbing layer 35 in place of O.

Figure 10:
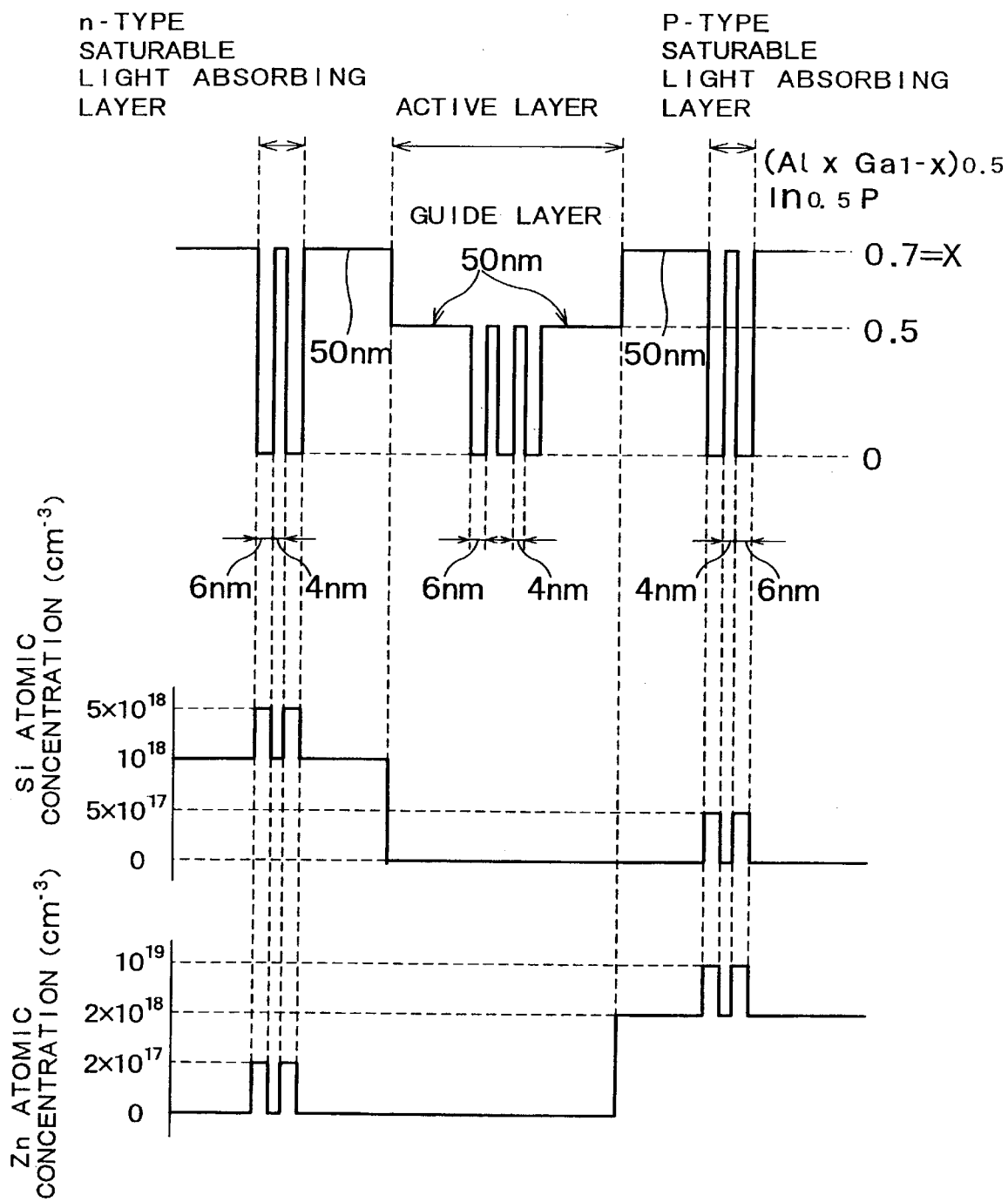
FIG. 10 is an illustration showing another example of composition and doping profile in a part of the semiconductor laser of FIG. 8.

FIG. 10 is an illustration showing another example of composition and doping profile in a part of the semiconductor laser shown in FIG. 8.

As shown in FIG. 10, the p-type saturable light absorbing layer 35 is similar to that shown in FIG. 2, but, the n-type saturable light absorbing layer 25 is inserted between the n-type AlGaInP clad layers 21 and 22. Here, Zn of $2\times10^{17}$ cm$^{-3}$ lower than Si atomic concentration is intentionally doped.

In the shown embodiment, since the refraction index profile is symmetric at both sides of the n-type layer and p-type layer, clear vertical near-field image can be obtained. Furthermore, in the same reason set out in the first embodiment, the self-pulsation can be generated at low threshold value, and the semiconductor laser having low drive current and long reliability can be obtained.

In the present invention, the saturable light absorbing layer is provided in a part of the first conductivity type clad layer and/or the second conductivity type clad layer. Since impurity and oxygen generating the conductivity type opposite to the saturable light absorbing layer is doped in the saturable light absorbing layer, non-luminescent recombination center is generated in the saturable light absorbing layer by doping to consume minority carrier.

By this, the minority carrier life of the saturable light absorbing layer is lowered to reduce necessary saturable light absorbing amount for self-pulsation to obtain low threshold value, low drive current and high reliability.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A semiconductor laser comprising:
   a first conductivity type semiconductor substrate;
   a first conductivity type clad layer disposed on said substrate;
   an active layer disposed on said first conductivity type layer;
   a second conductivity type clad layer disposed on said active layer;
   a buffer layer disposed on said second conductivity type clad layer; and
   a saturable light absorbing layer provided in at least one of said first conductivity type clad layer and said second conductivity type clad layer and having a band gap substantially equal to said active layer, said saturable light absorbing layer being doped with oxygen and an impurity generating the conductivity type of said clad layer.

2. A semiconductor laser as set forth in claim 1, wherein said active layer and/or said saturable light absorbing layer are quantum well structure or strained quantum well structure.

3. A semiconductor laser as set forth in claim 1, wherein
   said active layer, said clad layer and said saturable light absorbing layer are AlGaInP,
   said first conductivity type impurity is Si or Se; and
   said second conductivity type impurity is Zn or Mg.

4. A semiconductor laser as set forth in claim 1, wherein
   said active layer, said clad layer and said saturable light absorbing layer are AlGaAs,
   said first conductivity type impurity is Si or Se; and
   said second conductivity type impurity is Zn or Mg.

5. A semiconductor laser as set forth in claim 1, wherein a source of oxygen for oxygen doping is selected from the group consisting of oxygen gas, water, hydrogen peroxide solution, carbon monoxide and carbon dioxide.

6. A semiconductor laser comprising:
   a first conductivity type semiconductor substrate;
   a first conductivity type clad layer disposed on said substrate;
   an active layer disposed on said first conductivity type layer;
   a second conductivity type clad layer disposed on said active layer;
   a buffer layer disposed on said second conductivity type clad layer; and
   a saturable light absorbing layer provided in at least one of said first conductivity type clad layer and said second conductivity type clad layer and having a band gap substantially equal to said active layer, said saturable light absorbing layer being doped with an impurity generating a conductivity type opposite to said clad layer and not changing the conductivity type of said saturable light absorbing layer, and an impurity generating the conductivity type of said clad layer.

7. A semiconductor laser as set forth in claim 6, wherein said active layer and/or said saturable light absorbing layer are quantum well structure or strained quantum well structure.

8. A semiconductor laser as set forth in claim 6, wherein
   said active layer, said clad layer and said saturable light absorbing layer are AlGaInP,
   said first conductivity type impurity is Si or Se; and
   said second conductivity type impurity is Zn or Mg.

9. A semiconductor laser as set forth in claim 6, wherein
   said active layer, said clad layer and said saturable light absorbing layer are AlGaAs,
   said first conductivity type impurity is Si or Se; and
   said second conductivity type impurity is Zn or Mg.

10. A semiconductor laser as set forth in claim 6, wherein a layer thickness of quantum well layer of said saturable light absorbing layer is thicker than a layer thickness of quantum well layer of said active layer, and
    the quantum well layer of said saturable light absorbing layer is AlGaInP having greater Al content than quantum well layer of said active layer.

11. A semiconductor laser as set forth in claim 6, wherein
    in-plane compression strain amount of said saturable light absorbing layer is higher than in-plane compression strain amount of said active layer; and
    said quantum well layer of said saturable light absorbing layer is AlGaInP having greater Al content than the quantum well layer of said active layer.

12. A semiconductor laser as set forth in claim 6, wherein in-plane tension strain amount of said saturable light absorbing layer is lower than in-plane tension strain amount of said active layer; and
    said saturable light absorbing layer includes a quantum well layer of AlGaInP having greater Al content than the quantum well layer of said active layer.

13. A semiconductor laser as set forth in claim 6, wherein said saturable light absorbing layer has in-plane compression strain and said active layer has in-plane tension strain; and
    said saturable light absorbing layer includes a quantum well layer of AlGaInP having greater Al content than the quantum well layer of said active layer.

* * * * *